United States Patent [19]

Terasawa et al.

[11] 4,114,178
[45] Sep. 12, 1978

[54] SEMICONDUCTOR CONTROLLED RECTIFIER HAVING AN AUXILIARY REGION WITH LOCALIZED LOW RESISTANCE PATHS TO THE CONTROL GATE

[75] Inventors: Yoshio Terasawa, Katsuta; Shin Kimura, Hitachi, both of Japan

[73] Assignee: Hitachi, Ltd., Japan

[21] Appl. No.: 652,662

[22] Filed: Jan. 27, 1976

[30] Foreign Application Priority Data

Feb. 7, 1975 [JP] Japan ................................. 50-15404

[51] Int. Cl.² .......................................... H01L 29/74
[52] U.S. Cl. ....................................... 357/38; 357/20; 357/51; 357/68; 357/86
[58] Field of Search ....................... 357/20, 38, 39, 86, 357/68, 51

[56] References Cited

U.S. PATENT DOCUMENTS

| | | | |
|---|---|---|---|
| 3,476,989 | 11/1969 | Miles et al. | 357/38 |
| 3,566,211 | 2/1971 | Svedberg | 357/38 |
| 3,590,346 | 6/1971 | Bilo et al. | 357/38 |
| 3,638,042 | 1/1972 | Studtmann | 357/38 |
| 3,914,783 | 10/1975 | Terasawa | 357/38 |
| 3,968,512 | 7/1976 | Voss | 357/38 |
| 4,016,591 | 4/1977 | Terasawa | 357/38 |

FOREIGN PATENT DOCUMENTS 1,239,595   7/1971   United Kingdom ...................... 357/38

OTHER PUBLICATIONS

J. Garrett, "The Evolution of a High-Power Fast-Switching Thyristor," Electrical Engineering, vol. 48 #5, May 1971, pp. 33–35.

Primary Examiner—Joseph E. Clawson, Jr.
Attorney, Agent, or Firm—Craig & Antonelli

[57] ABSTRACT

A semiconductor controlled rectifier comprising a semiconductor substrate consisting of four layers doped alternately with p- and n-type impurities, a pair of main electrodes kept in ohmic contact with the outermost p- and n-type layers, an N auxiliary region in the intermediate p-type layer with an auxiliary contact thereto, and a gate electrode in contact with the intermediate p-type layer, wherein a portion of the gate electrode is disposed adjacent to the auxiliary region, where there are localized regions forming low resistance paths between the gate electrode and the auxiliary electrode.

13 Claims, 12 Drawing Figures

SEMICONDUCTOR CONTROLLED RECTIFIER HAVING AN AUXILIARY REGION WITH LOCALIZED LOW RESISTANCE PATHS TO THE CONTROL GATE

BACKGROUND OF THE INVENTION

1. Field of the Invention

The present invention relates to a semiconductor controlled rectifier which is turned on by a gating signal applied to the gate electrode.

2. Description of the Prior Art

A semiconductor controlled rectifier, which is turned on in response to a gating signal applied to the gate electrode, comprises a semiconductor substrate having at least four layers of P and N conductivity types, disposed alternately; a pair of main electrodes kept in ohmic contact with the outer surfaces of two outermost layers; and a gate electrode connected with one of the four layers of the substrate.

With such a semiconductor controlled rectifier as described above, if a gating signal voltage in the form of a pulse is applied between the gate electrode and one main electrode, with a forward voltage applied to make the other main electrode positive with respect to the one main electrode, then the semiconductor controlled rectifier switches from its OFF state to its ON state. Namely, upon the application of the pulse gating signal, current begins to flow between the two main electrodes, due to the gate current. The transition of the semiconductor controlled rectifier (hereafter referred to also as SCR) from its cut-off state to its conductive state is called "the turn-on" of the SCR. The turn-on of the SCR also takes place, independently of the application of the gating signal voltage, in case where the voltage applied between the main electrodes is higher than the maximum blocking voltage of the device, where the rate at which the voltage rises is great enough while the voltage itself is lower than the maximum blocking voltage, or where the rise in temperature of the device is high. If an SCR is turned on before the application of the gating signal while the voltage applied between the main electrodes is below the maximum blocking voltage of the device, the application of the device to an inverter, a chopper or other electric circuits is impossible. Therefore, it is essential for the SCR that the device is seldom turned on by itself even if the rate at which the voltage applied between the main electrodes rises (hereafter referred to for brevity as the "$dv/dt$") is high, that is, to improve the $dv/dt$ capability, and that the device is seldom turned on by itself even if the temperature thereof is high. How the SCR is turned on before the application of the gating signal if the $dv/dt$ or the temperature is high, will be explained as follows.

As the forward voltage applied to an SCR is increased, the width of the depletion layer formed on both the sides of the center PN junction which is to be reverse-biased increases. Consequently, a displacement current flows, which increases in proportion to the $dv/dt$ of the forward voltage. On the other hand, the reverse current, approximately proportional to the forward voltage, flows across the center junction. Due to the combined effect of the displacement current and the reverse current, the PN junctions between the intermediate layers and their adjacent outer layers (hereafter referred to as emitter junctions) are forward-biased to induce the injection of carriers from the outer layers to the intermediate ones. The degree to which the emitter junctions are forward-biased is great near the periphery of each emitter junction where the displacement current and the reverse current, which are generated in the center junction that does not overlap with the emitter junction when the layers are projected in a direction perpendicular to the layers, concentrate. Consequently, it happens that the turn-on takes place erroneously in or near the pheriphery of the emitter junction when the $dv/dt$ is high. On the other hand, if the temperature of the SCR is high, the carriers generated by thermal excitation in the depletion layer of the center junction increase so that the reverse current due to the carriers increases across the center junction. Thus, an erroneous turn-on is incurred when the temperature of the device is high, just as in case where the $dv/dt$ is high. In order to improve the $dv/dt$ and temperature capabilities, therefore, it is necessary to prevent the forward biasing of the emitter junctions by the displacement current and the reverse current. One artifice to attain the object is a shorted emitter configuration in which a portion of an intermediate layer is connected by penetrating the adjacent outermost layer with the associated main electrode. This configuration indeed improves the $dv/dt$ and temperature capabilities of the SCR to a considerable extent, but it still cannot be free from the following difficulties. Namely, due to the provision of the gate electrode on the outermost layer, there cannot be only small parts of emitter regions in the neighbourhood of the gate electrode. Accordingly, in order to increase the $dv/dt$ capability, the number of the shorted emitter portions in the area of the outermost layer faced to the gate electrode must be large.

On the other hand, the most important characteristics of the SCR are the initial turn-on area and the spreading of the conducting region in the initial stage of turn-on process. The area and the spreading velocity must be designed to be respectively as large and fast as possible, in order to increase the switching power capability. In order to fulfill this requirement, the number of the shorted emitter portions in the area of the outermost layer faced to the gate electrode must be decreased or preferably be reduced to zero.

According to the conventional method and techniques, as described above, a semiconductor controlled rectifier which has a large initial turn-on area and a high $dv/dt$ and temperature capabilities, cannot be obtained.

SUMMARY OF THE INVENTION

The object of the present invention is to provide a novel SCR which is completely free from the drawbacks of the conventional one. Particularly, the object is to provide a novel SCR in which a large turn-on area is obtained by a small gating signal current and which has a high $dv/dt$ and temperature capabilities.

The feature of the SCR according to the present invention, which can attain the above object, is that the gate electrode and the main electrode kept in contact with the outermost layer adjacent to the intermediate layer provided with the gate electrode are electrically connected to each other in the intermediate layer interposed between the gate electrode and the main electrode. Particularly, the feature is that a portion of the gate electrode is approximated to a portion of the main electrode on the intermediate layer so as to provide a bypass for gate current, displacement current and reverse current. With this configuration, the displacement current and the reverse current generated near the gate electrode are collected by the gate electrode and flow into the main electrode through the proximate portion between the gate electrode and the main electrode. Thus, the degradations in the $dv/dt$ and temperature capabilities due to the displacement current and the reverse current generated near the gate electrode can be eliminated.

An SCR using an amplifying gate configuration has been put into practice, in which the gating signal current is amplified by a minor four-layer region formed in the device to obtain a large turnon area by a small gating current and the amplified signal is used as the gate signal for the SCR. The present invention can also be applied to such an SCR.

DESCRIPTION OF THE PREFERRED EMBODIMENTS

The present invention will be described below by way of embodiment with the aid of the attached drawings.

Figure 1:
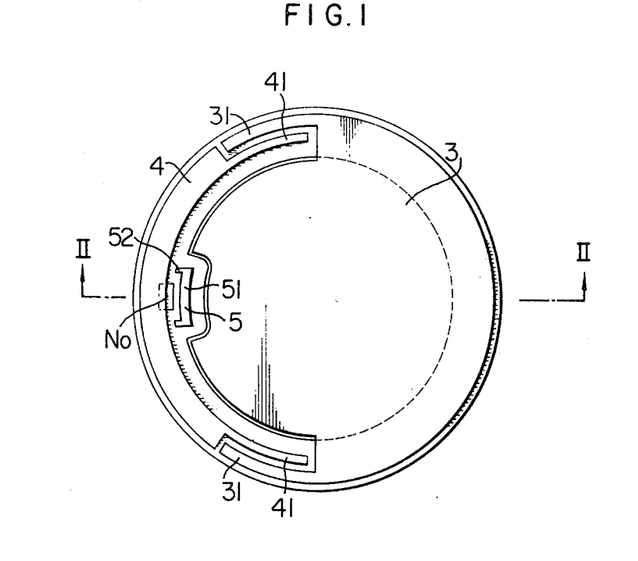
FIG. 1 shows in plan an SCR as a first embodiment of the present invention.
Figure 2:
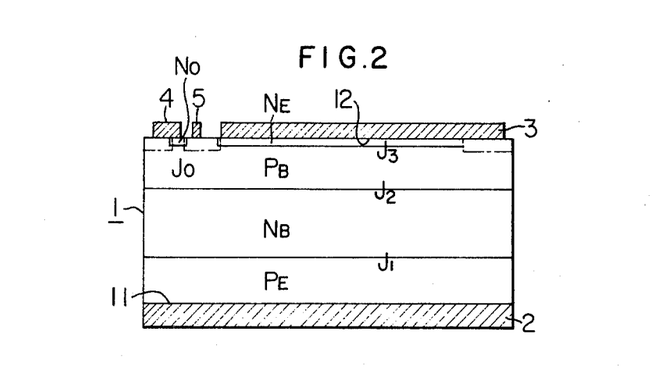
FIG. 2 is a cross sectional view taken along line II—II in FIG. 1.

In FIGS. 1 and 2, showing a first embodiment of the present invention, there is shown an SCR having a semiconductor substrate 1 consisting of four layers $P_E$, $N_B$, $P_B$ and $N_E$ of alternate p- and n-types. The substrate 1 has a pair of main surfaces 11 and 12, disposed parallel and opposite to each other. The layer $P_E$ is an emitter layer of p-type conductivity (so referred to hereafter as "$P_E$ layer"). The layer $N_B$ is a base layer of n-type conductivity (referred to hereafter as "$N_B$ layer"), to form a first PN junction $J_1$ with the $P_E$ layer. The layer $P_B$ is a base layer of p-type conductivity (also referred to as "$P_B$ layer"), disposed adjacent to the $N_B$ layer to form a second PN junction $J_2$ therewith. The layer $N_E$ is an emitter layer of n-type conductivity (so referred to hereafter as "$N_E$ layer"), formed in the surface of the $P_B$ layer with its surface exposed in the main surface and establishes a third PN junction $J_3$ with the $P_B$ layer.

The exposed surface of the $P_E$ layer serves as one main surface 11 and the exposed surfaces of the $N_E$ layer and the $P_B$ layer form the other main surface 12. An auxiliary region $N_o$ is a layer of n-type conductivity, formed in the $P_B$ layer with its surface exposed in the other main surface 12, isolated from the $N_E$ layer by the $P_B$ layer and having a smaller area than the $N_E$ layer. A first main electrode 2 is kept in low resistance contact with the $P_E$ layer in the first main surface 11 and a second main electrode 3 is also kept in low resistance contact with the $N_E$ layer and the portion of the $P_B$ layer surrounding the $N_E$ layer in the second main surface 12. An auxiliary electrode 4 is kept in contact with the surfaces of the auxiliary region $N_o$ and the $P_B$ layer, isolated from the $N_E$ layer. The auxiliary electrode 4 extends along the periphery of the $N_E$ layer and the end portions 41 of the auxiliary electrode 4 are embraced by the protruding portions 31 of the second main electrode 3.

A gate electrode 5 is provided on the $P_B$ layer between the $N_E$ layer and the auxiliary region $N_o$ and the gate electrode 5 has a first portion 51 arranged opposite to the auxiliary region $N_o$ and second portions 52 integrally formed at the ends of the first portion 51 and protruding toward the auxiliary electrode 4. The electrical resistance between the second portions 52 and the auxiliary electrode 4 is smaller than that between the first portion 51 and the auxiliary region $N_o$. Also, the electrical resistance between the outer peripheries of the end portions 41 and the protruding portions 31 is smaller than that between the other portion of the auxiliary electrode 4 and the $N_E$ layer.

The operation of the SCR having such configuration as described above will be described. When a forward voltage is applied between the main electrodes with the first main electrode 2 positive with respect to the second main electrode 3, the second PN junction $J_2$ is reverse-biased to give rise to displacement current and reverse current. The displacement and the reverse currents flow through the shorted emitter path (not shown) into the second main electrode 3, in the central area of the substrate 1 just beneath the $N_E$ layer while in and near the peripheral portion of the substrate 1 where the surface of the $P_B$ layer is in contact with the second main electrode 3 these currents flows directly into the second main electrode 3. In and near the portion of the substrate 1 where the surface of the $P_B$ layer is in contact with the auxiliary electrode 4, these currents flow into the second main electrode 3 via the auxiliary electrode 4 and the portion of the $P_B$ layer between the end portions 41 of the auxiliary electrode 4 and the protruding portions 31 of the main electrode 3. And in and near the portion of the substrate 1 where the surface of the $P_B$ layer is in contact with the gate electrode 5, these currents flow into the main electrode 3 via the gate electrode 5, its second portions 52, the $P_B$ layer, the auxiliary electrode 4, the end portions 41 of the electrode 4 and the $P_B$ layer. Accordingly, the displacement and reverse currents are prevented from forward-biasing the third PN junction $J_3$ so that the $dv/dt$ and temperature capabilities can be improved.

Now suppose that a gating signal voltage is applied to make the gate electrode 5 positive with respect to the second main electrode 3 with the first main electrode 2 positive relative to the second main electrode 3. Upon the application of the gating signal voltage between the electrodes 5 and 3, a gate current first flows into the second main electrode, starting at the second portions 52 of the gate electrode 5 and passing through the $P_B$ layer, the auxiliary electrode 4, its end portions 41 and the $P_B$ layer. This gate current never contributes to the turn-on of the SCR. As such a gate current increases, the voltage drop across the portion of the $P_B$ layer between the second portions 52 of the gate electrode 5 and the auxiliary electrode 4 increases. When the voltage drop exceeds the built-in voltage of the PN junction $J_o$ between the auxiliary region $N_o$ and the $P_B$ layer, the gate current begins to flow into the auxiliary region $N_o$ across the PN junction $J_o$. Consequently, the gate current properly acts for the four-layer region with the auxiliary region $N_o$ as the outermost layer. The four-layer region is then turned on by the gate current to cause the forward current (turn-on current) to flow through the four-layer region so that the forward current flows through the auxiliary electrode 4 into the periphery of the $N_E$ layer. This flowing of the current into the $N_E$ layer causes the four-layer structure having the $N_E$ layer as the outermost layer, i.e., the SCR itself, to turn on.

With this type of turn-on operation, the gate current does not flow through the PN junction $J_o$ at first so that some amount of the gate current is consumed uselessly but the $dv/dt$ and temperature capabilities can be improved.

As described above, according to the structure of the SCR shown in FIGS. 1 and 2, high $dv/dt$ and temperature capabilities can be obtained and a large turn-on area can be developed by a small gate current. Moreover, the SCR shown in FIGS. 1 and 2, which is the first embodiment of the present invention, has the following merit. Namely, since the second portions 52 of the gate electrode 5 are disposed opposite to the auxiliary electrode 4, on the surface of the $P_B$ layer, the control of the electrical resistance between the two electrodes 4 and 5 is facilitated (that is, reproducibility is improved). For the $P_B$ layer has a low impurity concentration and a small concentration gradient and therefore even when the etching is not uniform in the case where the resistance is controlled by etching the $P_B$ layer the deviation of the resistance of the resulting device can be made small. That the deviation of the resistance is small, means that SCR's having approximately the same minimum firing gate current and approximately the same $dv/dt$ and temperature capabilities can be easily obtained with high reproducibility.

Nowadays, circuits such as converters for D.C. power transmission, in which a plurality of SCR's are used in series-parallel configuration, are increasing and in each of such circuits it is necessary for well balancing of the voltages and currents distributed to the respective devices that the devices have the same turn-on characteristic. The SCR's according to the present invention are well adapted for such circuits because these SCR's have a smaller finger voltage (i.e., the minimum forward voltage necessary to turn on SCR) than a conventional SCR.

The variations of the embodiment shown in FIGS. 1 and 2 are, for example, as follows. (1) An SCR as shown in FIGS. 1 and 2, wherein the gate electrode 5 is provided on the peripheral portion of the substrate 1 so that the gate electrode 5 may be disposed between the auxiliary region $N_o$ and the second main electrode 3. (2) An SCR as shown in FIGS. 1 and 2, wherein the auxiliary electrode 4 is in the shape of ring so as to encircle the $N_E$ layer and wherein the electrodes 4 and 5 are disposed opposite to each other on the arbitrary portion of the $P_B$ layer. (3) An SCR as shown in FIGS. 1 and 2, wherein the surface of the $P_B$ layer exposed in the second main surface 3 is etched down as indicated by the broken line in FIG. 2. (4) An SCR as shown in FIGS. 1 and 2, wherein a portion of the second main electrode 3 is extended beyond the periphery of the $N_E$ layer toward the gate electrode 5 so that the extended portion is disposed opposite to the gate electrode 5 on the $P_B$ layer.

Figure 3:
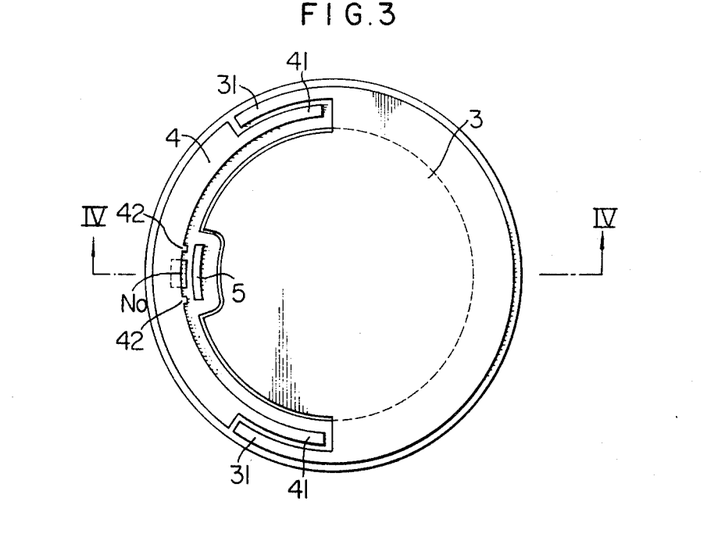
FIG. 3 shows in plan an SCR as a second embodiment of the present invention.
Figure 4:
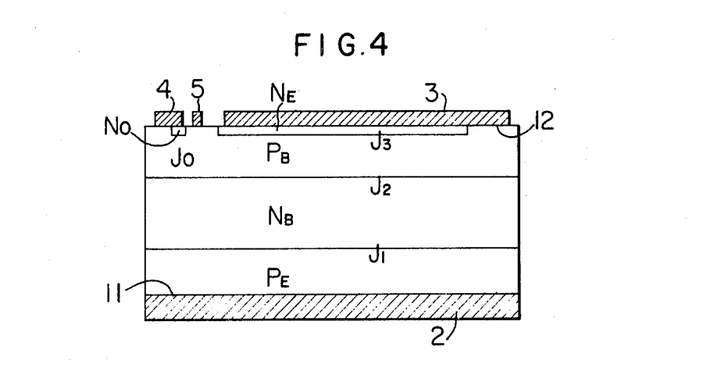
FIG. 4 is a cross sectional view taken along line IV—IV in FIG. 3.

FIGS. 3 and 4 show an SCR as a second embodiment of the present invention, in which the only difference from the first embodiment is the provision of protrusions 42 toward the gate electrode 5 at the portions of the auxiliary electrode 4 near the ends of the auxiliary region $N_o$.

Figure 5:
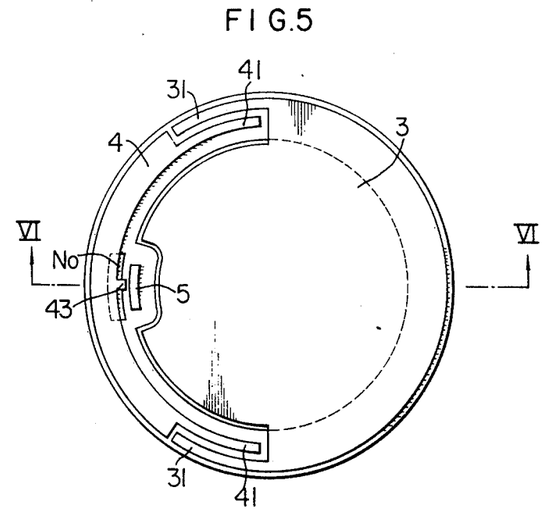
FIG. 5 shows in plan an SCR as a third embodiment of the present invention.
Figure 6:
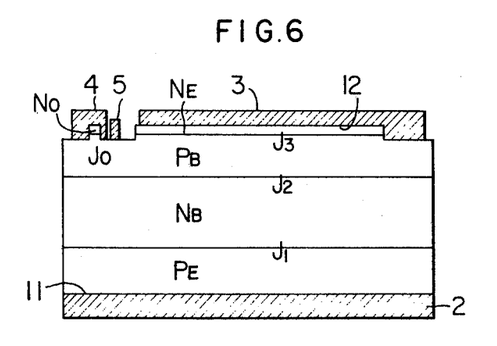
FIG. 6 is a cross sectional view taken along line VI—VI in FIG. 5.

FIGS. 5 and 6 show an SCR as a third embodiment of the present invention, in which the difference from the first and second embodiments is the provision of a protrusion 43 in the auxiliary electrode 4, extending beyond the auxiliary region $N_o$ at the center thereof toward the gate electrode 5. The second and third embodiments can enjoy the same performance as the first embodiment and be modified in the same manner as above.

Figure 7:
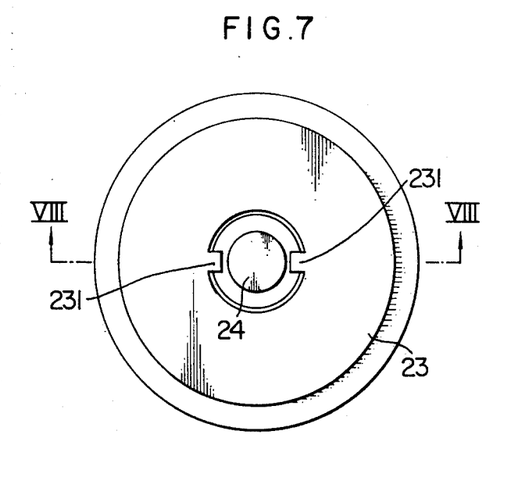
FIG. 7 shows in plan an SCR as a fourth embodiment of the present invention.
Figure 8:
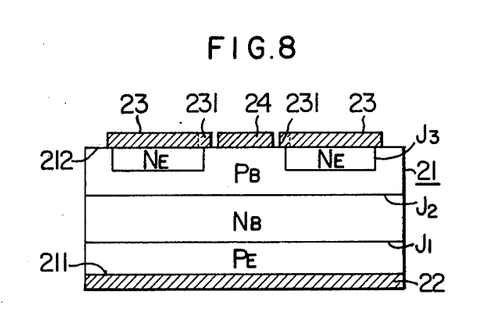
FIG. 8 is a cross sectional view taken along line VIII—VIII in FIG. 7.

FIGS. 7 and 8 show an SCR as a fourth embodiment of the present invention. In FIGS. 7 and 8, a semiconductor substrate 21 comprises a pair of main surfaces 211 and 212, four layers $P_E$, $N_B$, $P_B$ and $N_E$, and a first, a second and a third PN junctions $J_1$, $J_2$ and $J_3$ formed between the adjacent layers. The layer $N_E$ is so formed in the surface of the $P_B$ layer as to expose its surface in the second main surface 212 with the central portion of its surface penetrated by the $P_B$ layer. A first main electrode 22 is kept in low resistance contact with the first main surface 211 of the substrate 21 and a second main electrode 23 is kept in low resistance contact with the surface of the $N_E$ layer and with the surface of the portion of the $P_B$ layer around the $N_E$ layer. A gate electrode 24 is kept in contact with the surface of the portion of the $P_B$ layer surrounded by the $N_E$ layer. The second main electrode 23 has protrusions 231 extending beyond the $N_E$ layer toward the gate electrode 24. With this structure, the $dv/dt$ and temperature capabilities can be improved.

Figure 9:
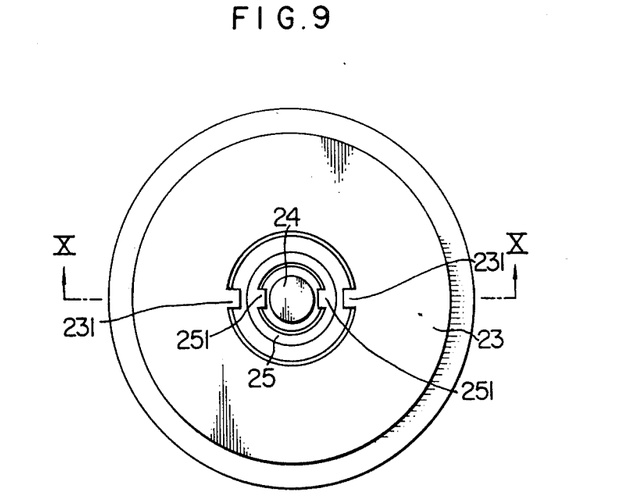
FIG. 9 shows in plan an SCR as a fifth embodiment of the present invention.
Figure 10:
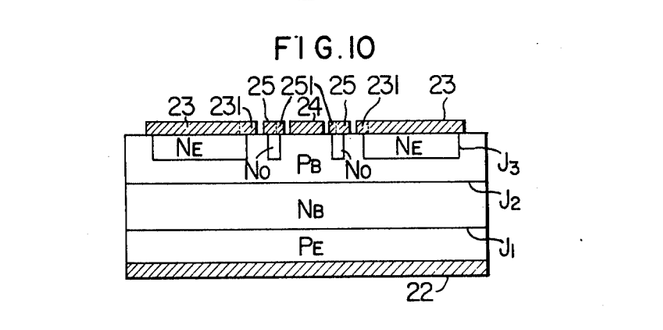
FIG. 10 is a cross sectional view taken along line X—X in FIG. 9.

FIGS. 9 and 10 show an SCR as a fifth embodiment of the present invention, in which the only difference from the fourth embodiment is the additional provision of a configuration for amplifying the gate current. The structure of this fifth embodiment is as follows. In the SCR shown in FIGS. 7 and 8, a ring-shaped auxiliary region $N_o$ is formed in the portion of the $P_B$ layer between the $N_E$ layer and the gate electrode 24, with its surface exposed in the second main surface 212; an auxiliary electrode 25 is disposed in contact with the surface of the auxiliary region $N_o$ and with the surface of the portion of the $P_B$ layer contiguous over the outer periphery of the auxiliary region $N_o$; and the auxiliary electrode 25 has protrusions 251 at the inner periphery thereof, extending beyond the auxiliary region $N_o$ toward the gate electrode 24.

Figure 11:
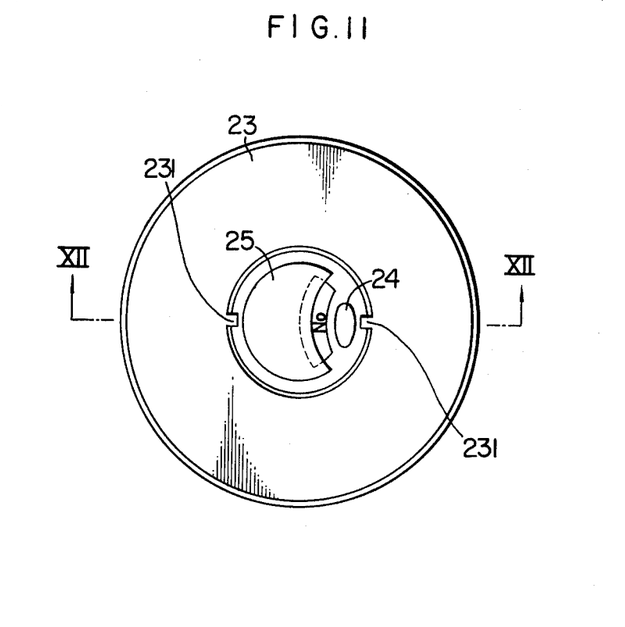
FIG. 11 shows in plan an SCR as a sixth embodiment of the present invention.
Figure 12:
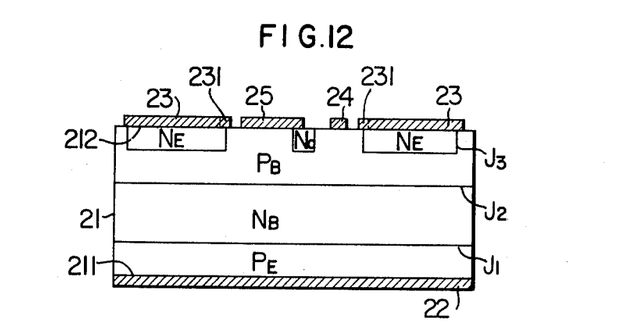
FIG. 12 is a cross sectional view taken along line XII—XII in FIG. 11.

FIGS. 11 and 12 show an SCR as a sixth embodiment of the present invention, in which the difference from the fifth embodiment is that the auxiliary region $N_o$ is not in the shape of a ring. In this embodiment, one of the protrusions 231 of the second main electrode 23 is approximated to the gate electrode 24 while the other protrusion of the second main electrode 23 is disposed proximate to the auxiliary electrode 25. The difference of the fifth or sixth embodiment from the first one is that the gate electrode is encircled by the $N_E$ layer and all these embodiments have almost the same function.

Finally, the present invention will be described numerically. An SCR having such a structure as shown in FIGS. 1 and 2 and having a blocking voltage of 4000 V and a rated average current of 800 A was compared with another SCR having almost the same structure but lacking only the portions corresponding to the second portions 52 of the gate electrode 5. As a result, the *dv/dt* capability of the former and the latter were respectively 3000 V/$\mu$sec and 1400 V/$\mu$sec at a junction temperature of 125° C. The minimum firing gate currents of the former and the latter are respectively 30 mA and 15 mA.

We claim:

1. A semiconductor controlled rectifier comprising:

a semiconductor substrate having a pair of main surfaces on the opposite sides of said substrate and a four layer structure between said main surfaces consisting of at least a first, a second, a third and a fourth layer of alternate p- and n-type conductivities, one of said main surfaces being formed of the exposed surfaces of at least said first and second layers and the other main surface being formed of the exposed surface of at least said fourth layer;

a first main electrode kept in low resistance contact with at least said first layer on said one main surface and partially protruding on the surface of said second layer beyond a p-n junction defined between said first layer and said second layer;

a second main electrode kept in low resistance contact with at least said fourth layer on said other main surface;

a gate electrode formed on said second layer on said one main surface and extending along the periphery of said first layer, a portion of said gate electrode being closer than the remaining portion thereof to the said partially protruding portion of said first main electrode; and an auxiliary region having the same conductivity type as said first layer and a smaller area than said first layer, formed in said second layer with a p-n junction defined between said auxiliary region and said second layer and exposed to said one main surface, and an auxiliary electrode disposed in contact with said auxiliary region and said second layer on said one main surface and being spaced apart from said first layer and extending along the periphery of said first layer.

2. A semiconductor controlled rectifier according to claim 1, wherein a further portion of said first main electrode partially protrudes on the surface of said second layer beyond the p-n junction defined between said first layer and said second layer, so that a portion of said auxiliary electrode extending along the periphery of said first layer is closer than the remaining portion thereof to the partially protruding further portion of said first main electrode.

3. A semiconductor controlled rectifier comprising:

a semiconductor substate having a pair of main surfaces on the opposite side of said substrate, a four layer structure between said main surfaces consisting of at least a first, a second, a third and a fourth layer of alternate p-n and n-type conductivities, one of said main surfaces being formed of the exposed surfaces of at least said first and second layers and the other main surface being formed of the exposed surface of at least said fourth layer, and an auxiliary region, having the same conductivity type as said first layer and a smaller area than said first layer, formed in said second layer with a p-n junction defined between said auxiliary region and said second layer and exposed to said one main surface;

a first main electrode kept in low resistance contact with at least said first layer on said one main surface;

a second main electrode kept in low resistance contact with at least said fourth layer on said other main surface;

a gate electrode extending along the periphery of said auxiliary region so as to be closer to said auxiliary region than to said first layer, said gate electrode being disposed on said one main surface; and an auxiliary electrode disposed in contact with said auxiliary region and said second layer on said one main surface and being spaced apart from said first layer and extending along the periphery of said first layer; and wherein said gate electrode is disposed to extend along and be spaced apart from said auxiliary electrode, and the electrical resistance between a portion of said gate electrode and said auxiliary electrode is smaller than that between the remaining portion of said gate electrode and said auxiliary region.

4. A semiconductor controlled rectifier as claimed in claim 3, wherein said gate electrode is disposed between said first layer and said auxiliary electrode.

5. A semiconductor controlled rectifier as claimed in claim 4, wherein a portion of that portion of said auxiliary electrode which is disposed on said auxiliary region protrudes toward said gate electrode beyond the p-n junction defined between said auxiliary region and said second layer so that said gate electrode is disposed closer to said auxiliary electrode than to said p-n junction.

6. A semiconductor controlled rectifier according to claim 5, wherein a portion of said first main electrode is adjacent to a portion of said auxiliary electrode on said second layer.

7. A semiconductor controlled rectifier as claimed in claim 4, wherein, along said auxiliary electrode, the length of said gate electrode exceeds the length of said auxiliary region and a portion of said auxiliary electrode protrudes toward said gate electrode on said second layer so that said gate electrode is disposed closer to said auxiliary electrode than to the p-n junction between said second layer and said auxiliary region.

8. A semiconductor controlled rectifier according to claim 7, wherein a portion of said first main electrode is adjacent to a portion of said auxiliary electrode on said second layer.

9. A semiconductor controlled rectifier according to claim 7, wherein a respective narrow side portion of said auxiliary electrode adjacent each respective end of said gate electrode protrudes toward said gate electrode so that the distance between the protruding portions of said auxiliary electrode and said gate electrode is less than the distance between that portion of said auxiliary electrode which is disposed between the protruding portions thereof and the p-n junction defined between said second layer and said auxiliary region.

10. A semiconductor controlled rectifier according to claim 4, wherein, along said auxiliary electrode, the length of said gate electrode exceeds the length of said auxiliary region and a portion of said gate electrode protrudes toward said auxiliary electrode so that said gate electrode is disposed closer to said auxiliary electrode than to the p-n junction between said second layer and said auxiliary region.

11. A semiconductor controlled rectifier according to claim 10, wherein a portion of said first main electrode is adjacent to a portion of said auxiliary electrode on said second layer.

12. A semiconductor controlled rectifier according to claim 10, wherein a respective narrow side portion of said gate electrode at each respective end thereof protrudes toward said auxiliary electrode so that the distance between the protruding portions of said gate electrode and said auxiliary electrode is less than the distance between that portion of said gate electrode which is bounded by the protruding portions at the ends thereof and the p-n junction defined between said second layer and said auxiliary region.

13. A semiconductor controlled-rectifier according to claim 3, wherein a portion of said first main electrode partially protrudes on the surface of said second layer beyond the p-n junction defined between said first layer and said second layer, so that a portion of said gate electrode is closer than the remaining portion thereof to the partially protruding portion of said first main electrode.

* * * * *